United States Patent [19]

Kawashima et al.

[11] Patent Number: 5,150,068

[45] Date of Patent: Sep. 22, 1992

[54] CLOCK SIGNAL SUPPLY METHOD AND SYSTEM

[75] Inventors: Seiichi Kawashima, Hadano; Noboru Masuda, Kokubunji; Shuichi Ishii, Sayama; Bunichi Fujita, Hadano, all of Japan

[73] Assignee: Hitachi, Ltd., Tokyo, Japan

[21] Appl. No.: 391,782

[22] Filed: Aug. 9, 1989

[30] Foreign Application Priority Data

Aug. 10, 1988 [JP] Japan .................... 63-199361

[51] Int. Cl.$^5$ .................. H03K 5/00; H03K 5/13
[52] U.S. Cl. .................... 328/155; 328/63; 328/72; 328/55; 307/262; 307/269; 307/602; 307/603
[58] Field of Search .............. 307/262, 269, 600, 602, 307/603; 328/63, 72, 155, 55; 331/1 A

[56] References Cited

U.S. PATENT DOCUMENTS

| | | | |
|---|---|---|---|
| 4,309,649 | 1/1982 | Naito .................... | 328/155 |
| 4,461,014 | 7/1984 | Fajino ................... | 328/155 |
| 4,495,473 | 1/1985 | Treise ................... | 328/155 |

OTHER PUBLICATIONS

Anceau, "A Synchronous Approach for Clocking VSLI System", IEEE Jor. Of SSC., vol. SC-17, No. 1, Feb. 1982.

Primary Examiner—Timothy P. Callahan
Attorney, Agent, or Firm—Antonelli, Terry, Stout & Kraus

[57] ABSTRACT

The present invention provides a clock signal supply method and system. A reference signal and a synchronizing signal are generated, as well as a clock signal, at a clock signal generating source end. Both the reference signal and the synchronizing signal have a period longer than that of the clock signal. The clock signal at a clock signal destination end is frequency divided in synchronism with the synchronizing signal to provide a sample to be compared with the reference signal. The resultant frequency-divided signal is compared with the reference signal in phase. A delay control is made for the clock signal in accordance with the result of the comparison to adjust the phase of the clock signal at the signal destinations.

15 Claims, 21 Drawing Sheets

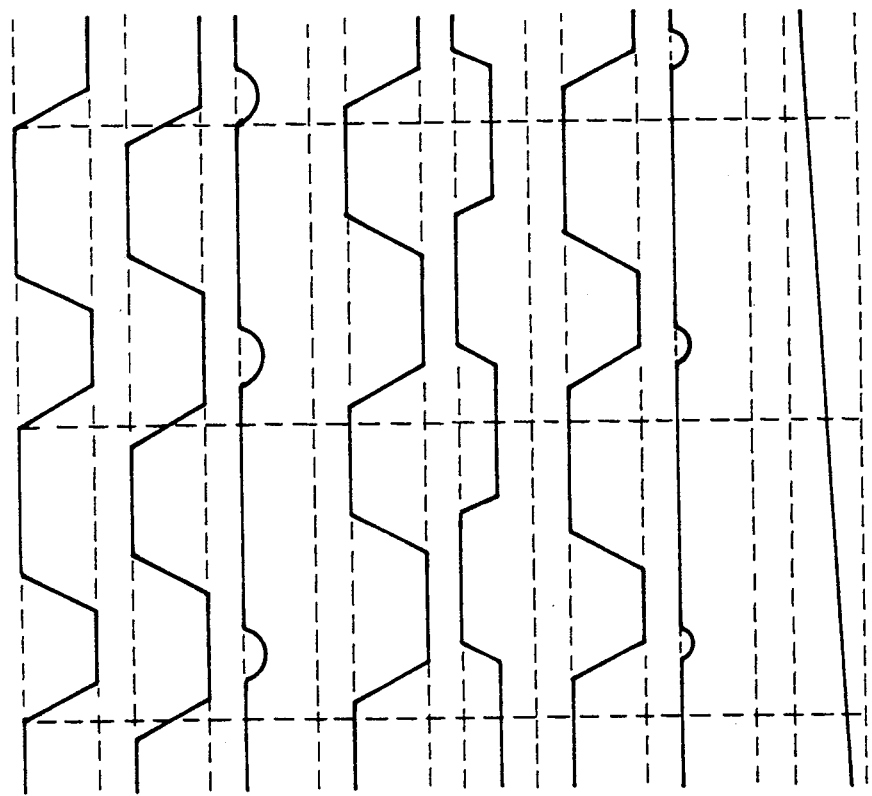

2501

CLOCK SIGNAL SUPPLY METHOD AND SYSTEM

BACKGROUND OF THE INVENTION a. Field of the Invention

This invention relates to a method and a system for supplying clock signals, and more particularly relates to a clock signal supplying method and system suitable for use in a clock supply section of a large-scale computer capable of carrying out arithmetic operations at a high speed.

b. Background Art

As a conventional method for adjusting phases of clock signals for a large-scale computer, there has generally been known a method in which the waveform of a clock signal is manually observed at each destination with oscilloscopes or the like and its phase is adjusted to that of a predetermined value. Other than the method using an oscilloscope, Japanese Patent Application Laid-Open Publication (Kokai) No. 61-39619 discloses a method which uses a ring oscillator formed by a clock supply circuit and detects signal delay time of the clock supply circuit from the oscillation frequency to adjust the same to a predetermined value.

However, these conventional methods are detrimental: the former method in which the phase adjustment of a clock signal is carried out manually with an oscilloscope or the like requires considerable time and trouble for adjustment and the number of points where the adjustment is made should be restricted. Consequently, the adjustment should be conducted at centralized relay points in the number of several tens to several hundreds, and signals must be transmitted to the terminal destinations positioned further ahead without adjustment. Possible variations in propagation time of the signals which are transmitted without adjustment would set a limitation in reduction of clock skews. If the adjustment currently conducted by hand is to be automated, it is necessary to make consecutively a probe to contact waveform observation points corresponding to respective adjustment points. This would require a mechanical positioning device.

If the adjusting points are large in number, contacts become congested, and the probe must be positioned with a high precision. Besides the precision requirement, speed should be high, thus posing further difficulty in realization of the system. If a signal line for the probe is provided separately for each observation point respectively, then mechanical positioning will not be necessary any more, but all the signal propagation times for the signal lines of the probe connected to the respective observation points should be set equal to each other. In order to make all of them identical, there will be needed all the same cumbersome operation as that of the adjustment of phases of clock signals, which requires many hands.

Above mentioned method of Kokai No. 61-39619 is also detrimental in that it has the similar problem to that of the former conventional method because all the signal propagation times should be uniform for the cables by which signals are fed back from destinations to input ends. In a large-scale computer, especially, machine cycle will be shortened more and more as the arithmetic operation increases its speed. Therefore, the phase adjustment points should be increased in number to reduce clock skews. The above mentioned problems will further present formidable difficulties in this context.

SUMMARY OF THE INVENTION

This invention was made to obviate the afore-mentioned problems encountered in the conventional methods and systems, and it is an object of the present invention to provide a method and a system for supplying clock signals which is capable of effecting automatic phase adjustment of clock signals at various destinations of the clock signals, while assuring compensation of clock skews with high accuracy.

The present invention features a clock signal supply method which comprises the steps of: generating a reference signal and a synchronizing signal as well as a clock signal at a clock signal generating source end, both of the reference signal and the synchronizing signal having a period longer than that of the clock signal, frequency-dividing the clock signal at a clock signal distribution end in synchronism with the synchronizing signal, comparing the resultant frequency-divided signal with the reference signal in phase, and controlling a delay of the clock signal in accordance with a result of the comparison.

The present invention further features a clock signal supply system which comprises a clock oscillator for generating a clock signal, a plurality of phase adjusting means for adjusting the phase of the clock signal supplied thereto to produce a phase-adjusted output, a first signal line for supplying the clock signal from the oscillator to each of the phase adjusting means, a reference signal generating means for generating a reference signal having a period longer than that of the clock signal which is used as a reference for the phase adjustment of the clock signal by the phase adjusting means, a second signal line for supplying the reference signal from the reference signal generating means to each of the phase adjusting means, frequency dividing means for dividing a frequency of the clock signal to produce a frequency-divided clock signal for comparison with the reference for the phase adjustment, a synchronizing signal generating means for generating a synchronizing signal having a period longer than that of the clock signal for synchronizing the frequency division by the dividing means, and a third signal line for supplying the synchronizing signal from the synchronizing signal generating means to each phase adjusting means.

The second signal line is preferably adjusted so that propagation time of the reference signal to each of the phase adjusting means is substantially the same.

The synchronizing signal from the synchronizing signal generating means is preferably supplied to each adjusting means in such a manner that the phase of the clock signal frequency-divided in response to the synchronizing signal may be close to the phase of the reference signal generated from said reference signal generation means.

The periods of the reference signal and of the synchronizing signal are, for example, two multiple or larger integral multiple of the period of the clock signal.

The phase adjusting means comprises, for example, a variable-delay circuit which variably delays the clock signal, a frequency dividing circuit for dividing the output from the variable-delay circuit, which may be the frequency dividing means as described above, and a phase comparator circuit which compares the output from the frequency dividing circuit with the phase of the reference signal to control the delay of the variable-delay circuits in accordance with the result of comparison by the phase comparator circuit.

Each of the phase adjusting means may further include a waveform shaper which shapes the output from the variable-delay circuit to input the shaped signal to the frequency dividing circuit.

Each phase adjusting means may further have a variable-delay circuit for variably delaying the synchronizing signal to control the delay of the variable-delay circuit in accordance with the result of the comparison at the phase comparator circuit.

The synchronizing signal from the synchronizing signal generating means may be supplied to each of the phase adjusting means by sharing the second signal line with the reference signal from the reference signal generation means.

In such a case, there may be provided a modulator which modulates the synchronizing signal from the synchronizing signal generating means to feed the same through the second signal line and a demodulator which demodulates the signal fed through the second signal line so that the output from the demodulator may be used as the synchronizing signal in the phase adjusting means.

The phase adjusting means further has a latch circuit which latches the output from the frequency dividing circuit in accordance with the output from the variable-delay circuit so that the output from the latch circuit may be supplied to the phase comparator circuit.

The phase adjusting means, alternatively, comprises a variable-delay circuit which variably delays the clock signal, a counter which counts the output from the variable-delay circuit in synchronism with the synchronizing signal, a decoder which decodes the output from the counter to produce a plurality of different outputs, and a latch circuit which latches the outputs from the decoder in accordance with the output from the variable-delay circuit so that one of the outputs from the latch circuit may be supplied to the phase comparator circuit.

If the phase-adjusted clock signal from the phase-adjusting means is to be supplied further to plural terminal destinations, the output from each of the phase adjusting means is provided in the form of complementary signals. A differential circuit is provided at each of the plural terminal destinations and the complementary clock signals are applied thereto by transmitting them through the differential circuits in the orders opposite each other.

According to this invention, a reference signal having a longer period than the clock signal (or low frequency) is fed as well as the clock signal generated at the clock signal generating source to clock signal destinations, and the phase of the clock signal is adjusted by the phase adjusting means provided at each of the destinations, referring to the reference signal. More specifically, the phase adjusting means compares the phase of the signal obtained by dividing the frequency of the clock signal with the phase of the reference signal and controls a delay of the clock signal so that the phases may align according to the comparison result. If the phases of the reference signals arriving at the respective phase adjusting means are aligned, the phases of the clock signals from the respective phase adjusting means are automatically aligned with each other.

To facilitate phase alignment of the reference signals between the phase adjusting means, the reference signal is divided at the clock signal generating source to have a lower frequency than the clock signals.

As mentioned above, the clock signal is frequency-divided for phase comparison with the reference signal at each of the phase adjusting means. In order to synchronize the dividing operation between the destinations, a synchronizing signal having a period longer than that of the clock signal is generated at the source to be used as a synchronizing signal for synchronizing the frequency division of the clock signal at each destination. By adjusting the phase of the synchronizing signal appropriately, the phase of the clock signal which is to be used for comparison with the reference signal may be substantially coincided with the phase of the reference signal even if an excessive delay control variable is not set at each of the adjusting means.

This invention therefore can accurately detect phase deviation of the clock signal of high frequency at each destination, and can automatically compensate skews of the clock signal at each destination in accordance with the detected deviation without requiring a manual operation.

When the synchronizing signal is also controlled for its delay at each phase adjusting means in a manner similar to that of the delay control of the clock signal, such a disadvantage can be avoided that the clock signals differing in phase by an integral multiple of period might otherwise be matched.

If the modulator and demodulator are employed so that a signal line may be used in common for the reference line and the synchronizing signal, one signal line extending from the source of the clock signal to each of the phase adjusting means can be omitted.

The clock signals may be supplied from each of the phase adjusting means to plural further terminal destinations. In this case, the clock signals can be supplied to a larger number of terminal destinations by a relatively small number of phase adjusting means. The output clock signals from these phase adjusting means may be used as complementary signals and differential circuits may be provided at the respective terminal destinations so that the complementary signals are applied through the differential circuits in opposite orders. Thus, the clock signals can be distributed to the terminal destinations, while maintaining a high phase alignment precision.

BRIEF DESCRIPTION OF THE DRAWINGS

FIGS. 18A and 18B are waveform charts to explain the operation of FIG. 17;

DESCRIPTION OF THE EMBODIMENTS

Embodiments of this invention will now be described referring to attached drawings.

Figure 1:
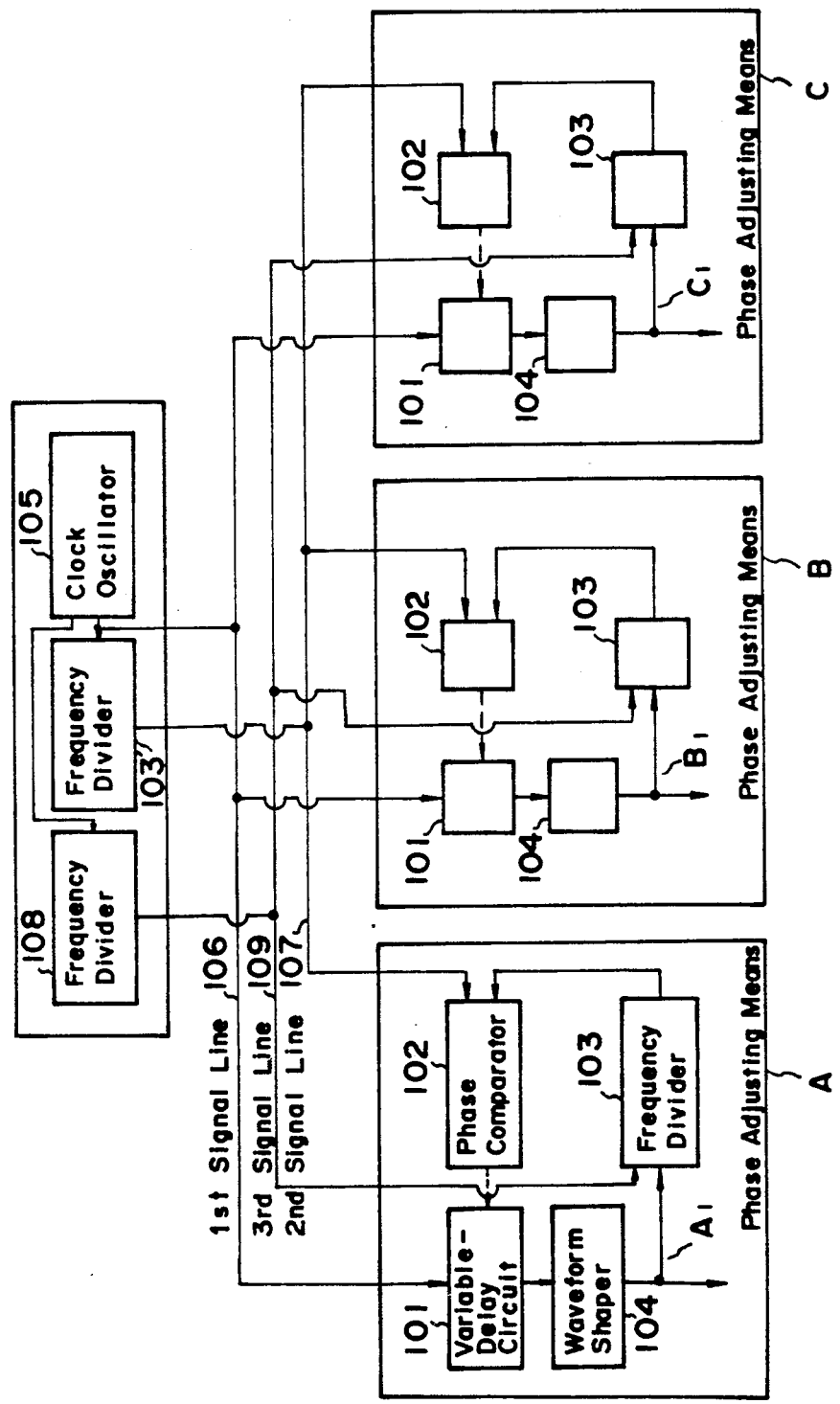
FIG. 1 is a block diagram showing a first embodiment of the invention.

FIG. 1 shows a configuration of a first embodiment of the present invention. In the figure, the reference numeral 105 denotes a clock oscillator, and the letters A, B and C denote phase adjusting means each provided at destinations of the clock signals, respectively, for adjusting phases of clock signals. The reference numeral 106 denotes a first signal line through which the clock signals are supplied from the clock oscillator 105 to each phase adjusting means, 103' a reference signal generating means which forms reference signals for phase adjustment, and 108 a synchronizing signal generating means which forms synchronizing signals in order to synchronize frequency dividers 103 each provided within the respective phase adjusting means 108 with the reference signal generation means 103'. In the embodiment as illustrated, the reference signal generating means 103' and the synchronizing signal generating means 108 comprise frequency dividers which divide clock signals generated by the clock oscillator 105. The reference numeral 107 denotes a second signal line through which the reference signal formed by the frequency divider 103' or the reference signal generating means is supplied to the phase adjusting means provided at each destination. The reference 109 denotes a third signal line through which the synchronizing signal formed by the frequency divider 108 or the synchronizing signal generating means is supplied to each of the phase adjusting means provided at each destination of clock signals.

The phase adjusting means A, B and C provided respectively at destinations of the clock signals comprise a variable-delay circuit 101 which controls the delay times of the clock signals, a waveform shaping circuit 104 which shapes the signals passed through the variable-delay circuit 101 into a desired clock signal waveform, a frequency divider 103 which divides the so shaped clock signals in synchronism with the synchronizing signal sent through the third signal line 109, and a phase comparator circuit 102 which compares the phase of the output from the frequency divider 103 with the phase of the reference signal fed through the second signal line 107 to detect a phase difference therebetween.

The comparison result of the phase comparator circuit 102 is fed back to the variable-delay circuit 101 to adjust the transmission delay of the circuit 101 in such a manner as to effect coincidence between the phase of the output signal from the frequency divider 103 and that of the reference signal fed through the second signal line 107. The signal propagation times on the second signal line 107 to the destinations are adjusted to be identical to each other. Therefore, by aligning the phase of the clock signal supplied to each destination with the phase of the reference signal, the phases of the clock signals are all coincided between the destinations. The phase coincidence of the reference signals fed through the second signal line can be attained relatively easily because the frequency of the reference signal is lower than that of the clock signals fed through the first signal line 106.

The times required for the synchronizing signals to propagate to the destinations through the third signal line 109 are also adjusted to be substantially equal to each other. This further facilitates alignment of the phase of the clock signals with that of the reference signal, in which the reference signal is compared with the clock signal provided in the form of the output from the frequency divider 103 for dividing the clock signal supplied to each destination. However, the adjustment of the signal transmission time of the third signal line 109 is not so important as compared with the adjustment of the transmission time of the second signal line 107.

The operation of the circuit shown in FIG. 1 will now be described.

The clock signals generated by the clock oscillator 105 are supplied to the phase adjusting means A, B and C provided at the respective destinations. The waveforms of the clock signals may be rectangular or sinusoidal. For the first signal line 106, precise alignment of signal transmission time is not required. Therefore, an amplifier or a waveguide may be provided at an arbitrary location on the signal line 106 or signals may be converted into optical signals to allow transmission of signals having a short period.

The signal obtained by dividing the output from the clock oscillator 105 by the frequency divider 103' which is the reference signal generating means is transmitted through the second signal line 107 to be used as the reference for phase adjustment. The period of the signal fed through the second signal line is longer than that of the signal fed through the first signal line 106 and, therefore, they cause less attenuation in signal amplitude. However, all the propagation times of the signals from the frequency divider 103' to the phase comparator circuit 102 in the phase adjusting means should be aligned between the destination.

In the phase adjusting means A, B and C, the clock signal which has passed through the first signal line 106 is inputted to the variable-delay circuit 101 and adjusted in phase by a predetermined value, which will be described hereinlater. The output from the variable-delay circuit 101 is inputted to the waveform shaping circuit 104 and shaped to produce a shaped, phase-adjusted output.

A portion of the output from the shaping circuit 104 is inputted to the frequency divider 103 and frequency-divided in synchronism with the synchronizing signal transmitted through the third signal line 109. The frequency-divided signal is inputted to the phase comparator circuit 102 for comparison with the phase of the reference signal which is supplied to the phase adjustment means A, B and C through the second signal line 107. The comparator circuit 102 compares the signal with the phase of the reference signal and feeds back a control signal in the form of the comparison result to the variable-delay circuit 101 for delaying the phase of the clock signal by the amount necessary to align the phases of the two signals.

The synchronizing signal supplied to the phase adjustment means A, B and C via the third signal line 109 is used to substantially synchronize the dividing operation of the frequency divider 103 with that of the frequency divider 103'. If the synchronizing signal is not used, the dividing operations of the frequency dividers 103 at the respective phase adjusting means A, B and C start at arbitrary phases of the clock signals which are supplied through the first signal line 106. Then, the maximum phase difference between that and the reference signal supplied through the second signal line 107 becomes about one half of the output signals of the frequency dividers 103, 103', and the variable-delay circuit 101 needs to have a delay time longer than the time which is originally necessary to adjust variations in propagation time on the first signal line 106. It is therefore desirable that the synchronizing signals via the signal line 109 be supplied to the phase adjusting means A, B and C in the phase which is approximate to the phase of the reference signal supplied by the second signal line 107.

If the time required to transmit a signal from the clock oscillator 105 to the frequency divider 103 via the variable delay-circuit 101 in the phase adjusting means A and the point A1 is assumed as Ta, and those from the oscillator 105 to the frequency divider 103 via the variable-delay circuit 101 and the points B1 and C1 respectively are assumed as Tb and Tc, when there is a difference larger than one half period of the clock signal between Ta, Tb and Tc at an initial state, phases could be agreed by the difference which is equivalent to integral multiples of the period of the clock signals in a steady state. There will be no problems if the oscillator period of the oscillator 105 is stable, but when the oscillation period is varied, skews would arise. In order to avoid skews, clock signals may be supplied initially with an extended oscillation period of the oscillator 105 until the delay time of the variable-delay circuit 101 becomes steady, when the oscillator 105 starts to be operated with a desired period.

Specific examples of the component elements of the first embodiment will now be discussed.

FIGS. 2 through 5 show specific examples of the variable-delay circuit 101 shown in FIG. 1.

Figure 2:
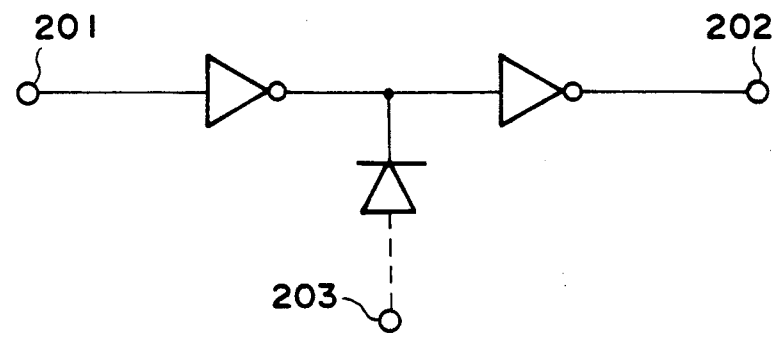
FIGS. 2 through 6 and 8 through 11 are circuit diagrams and block diagrams showing component elements of the first embodiment.

FIG. 2 shows a circuit which utilizes the phenomenon that coupling capacitance of a diode changes by the applied voltage. In the circuit, the load capacity on the left side gate circuit is varied with the control voltage applied to a control terminal 203 to control the delay time.

Figure 3:
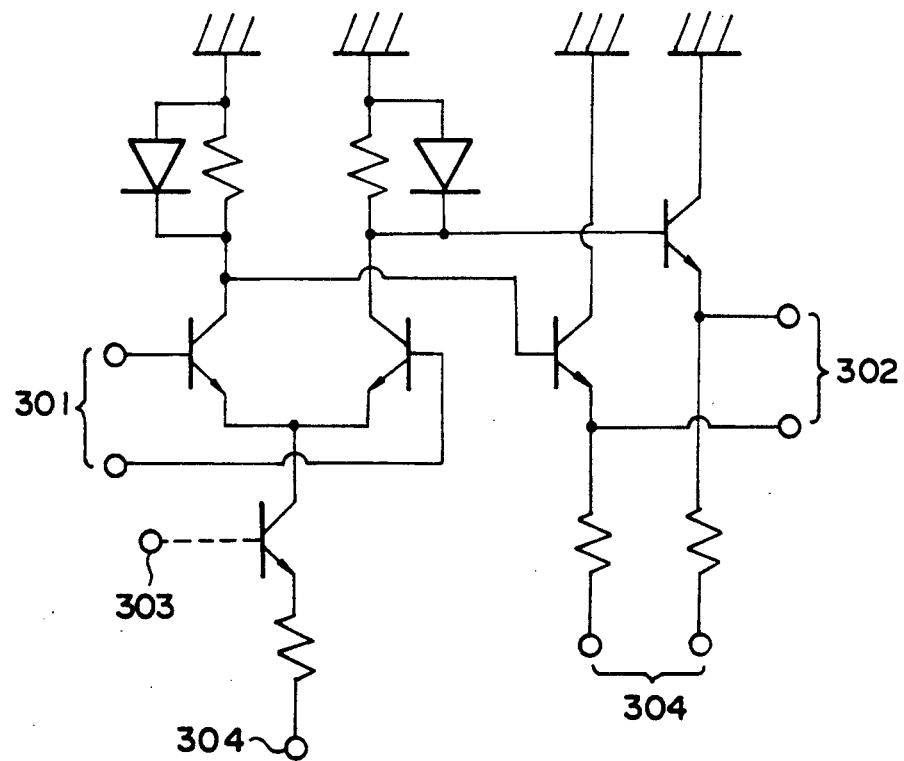

FIG. 3 shows a circuit which controls the delay time by controlling the electric current flowing through the differential circuit by varying the control voltage and changing the coupling capacitance of the clamping diode with increase/decrease of discharge current. This circuit is used by inputting differential signals at an input terminal 301 or applying voltage of an intermediate level to one of the input terminals 301. As this circuit can control the delay time at fall time but not quite the delay time at rise, the pulse width changes when the output is not used as a differential signal. Such inconvenience may be avoided by connecting the circuit shown in FIG. 3 in two stages.

Figure 4:
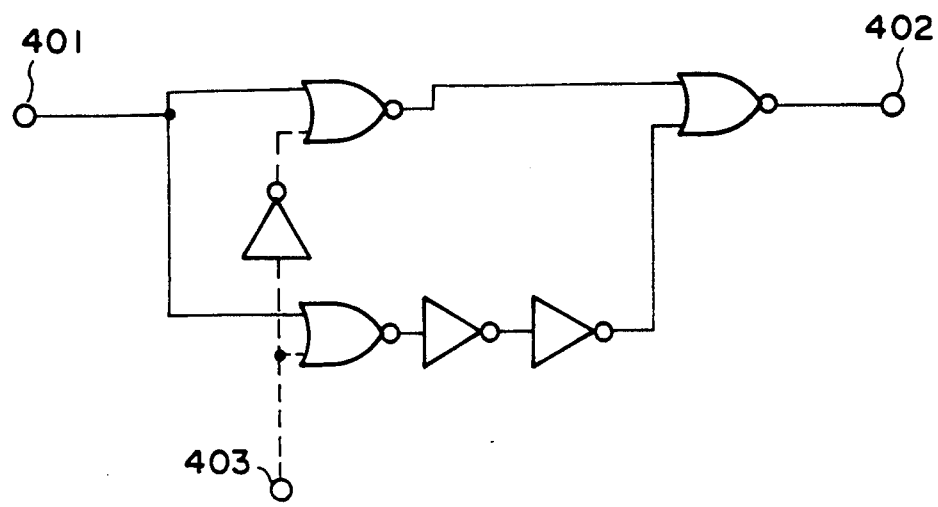
Figure 5:
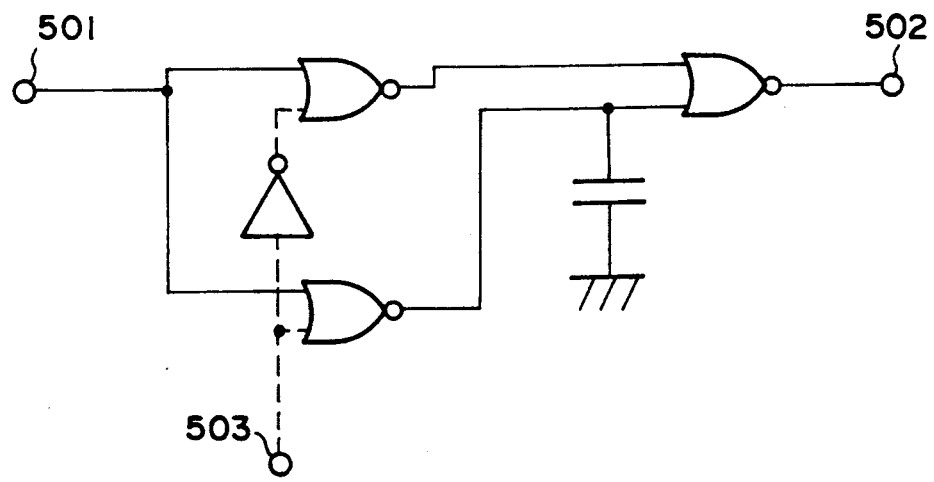

Circuits shown in FIGS. 4 and 5 are variable delay circuits of a digital control type wherein the delay time varies depending on which side of the passage a signal passes, i.e., whether the signal is passed through the upper passage or the lower passage. These circuits cannot effect continuous control as the analogue control type circuits shown in FIGS. 2 and 3, but can easily increase the delay amount. The circuit shown in FIG. 4 is especially advantages as the form of the pulse would not change substantially even if the amount of delay time increases. For constructing a variable-delay circuit of this invention only with digital control type circuits, it is necessary to connect several circuits of different variables of delay time in plural stages. If necessary, digital control type circuits and analogue control type circuits may be used in combination.

When digital control type variable-delay circuits shown in FIGS. 4 and 5 are used, so-called hazard may occur when the delay times are switched. Such hazard may be prevented by synchronizing the switching timing of the delay times with input signals of the circuit so that output signals would not become varied by switching. Once phase adjustment is completed, delay time is prevented from becoming switched by suspending the operating of the control system. These two methods may naturally be used in combination.

Figure 6:
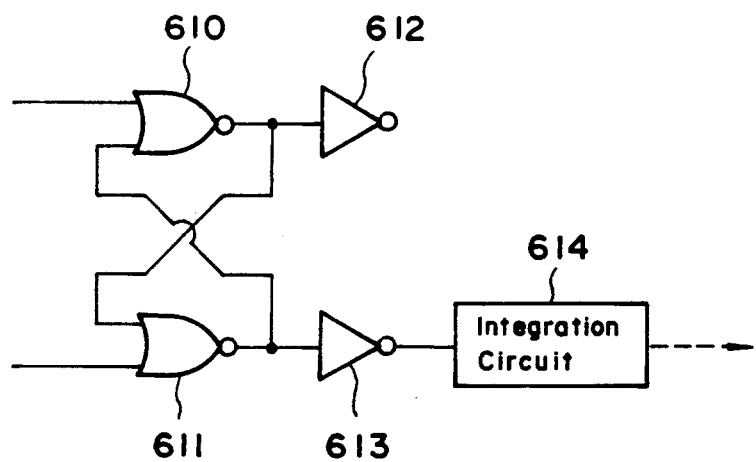

FIG. 6 shows a specific example of the phase comparator circuit 102 shown in FIG. 1. The variable-delay circuit 101 shown in FIG. 1 may be a circuit of the type which shortens the delay time when the control voltage is raised. In this case, the reference signal transmitted through the second signal line 107 is applied to a gate circuit 610 shown in FIG. 6 while the output from the frequency divider 103 is applied to a gate circuit 611. The time constant of an integration circuit 614 is set to be sufficiently longer than the period of the signals applied to the gate circuits 610, 611.

Figure 7A:
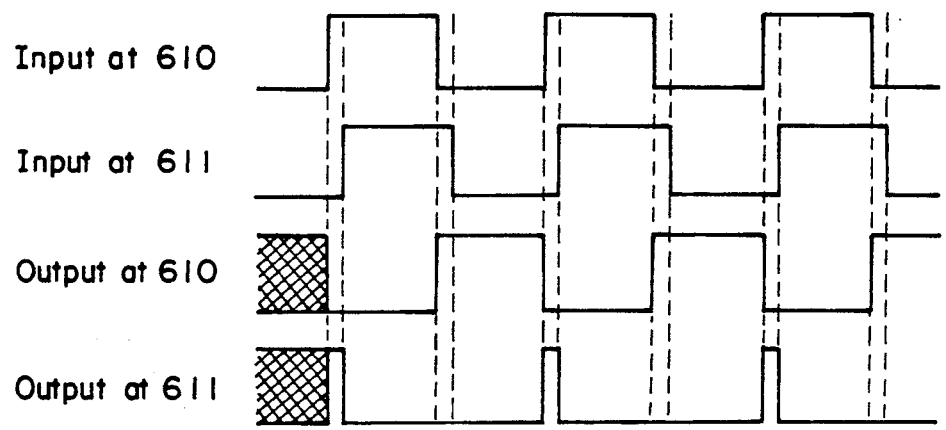
FIGS. 7A and 7B are waveform charts to explain the operation of the circuit shown in FIG. 6.
Figure 7B:
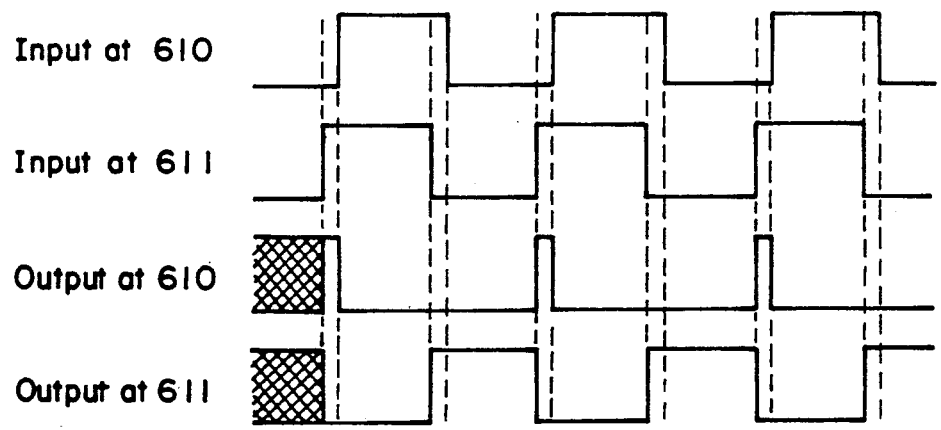

The relationship between the input and output of the gate circuits 610 and 611 is illustrated in FIGS. 7A and 7B. In the output waveforms in FIGS. 7A and 7B, the delay time at the gate circuits 610, 611 is ignored. When the phase of the signal applied to the gate circuit 611 is delayed from that of the signal applied to the gate circuit 610, the mean value of the outputs of the gate circuit 611 becomes close to the low level. When the output is inputted to the integration circuit 614 via an inverter 613 for buffer, the mean value of the outputs the inverter 613 becomes close to that of the high level and the output voltage of the integration circuit 614 gradually increases while the delay time in the variable-delay circuit 101 shortens. Therefore, the phase of the signals applied to the gate circuit 611 is advanced.

Conversely, when the phase of the signals applied to the gate circuit 611 is ahead of the phase of the signals applied to the gate circuit 610, as shown in FIG. 7B, the mean value of the outputs from the gate circuit 611 becomes close to the mean value of the high level and the low level to gradually decrease the output voltage from the integration circuit 614, while delaying the phase of the signals applied to the gate circuit 611. Accordingly, in a steady state, the phase of the signals applied to the gate circuits 610 and 611 are substantially coincidental to each other. Gate circuit 612 is used for matching the load conditions of the gate circuits 610 and 611. If the gate circuits 610 through 613 are arranged closely within a single integrated circuit, the difference in delay time between the gate circuits 610 and 611 can be reduced to thereby improve the precision in positional adjustment.

The clock oscillator 105 shown in FIG. 1 may be constructed similarly to the clock oscillators generally used for conventional computers. The method of constructing a frequency divider is shown by examples of various circuits in SSI catalogue or the like, and its description is therefore omitted herein. The waveform shaper 104 may be formed by connecting an amplifier and a clamping circuit if it suffices to shape rectangular waves. However, if shaping is to be made with accuracy in pulse width, a $\frac{1}{2}$ frequency divider may be employed to obtain waveforms of almost 50% duty cycle. Other duties may be set by using a counter or the like.

FIGS. 8 through 11 show other forms of a phase adjusting means employable in the present invention. The phase adjusting means provided at each of the destinations shown in FIG. 1 may be replaced by any one of those shown in FIGS. 8 through 11.

If a latch circuit LAT is provided as shown in FIGS. 8 through 11, fluctuation in delay time at the frequency dividers provided at phase adjusting means can be absorbed to thereby increase the precision in phase adjustment of clock signals.

Figure 10:
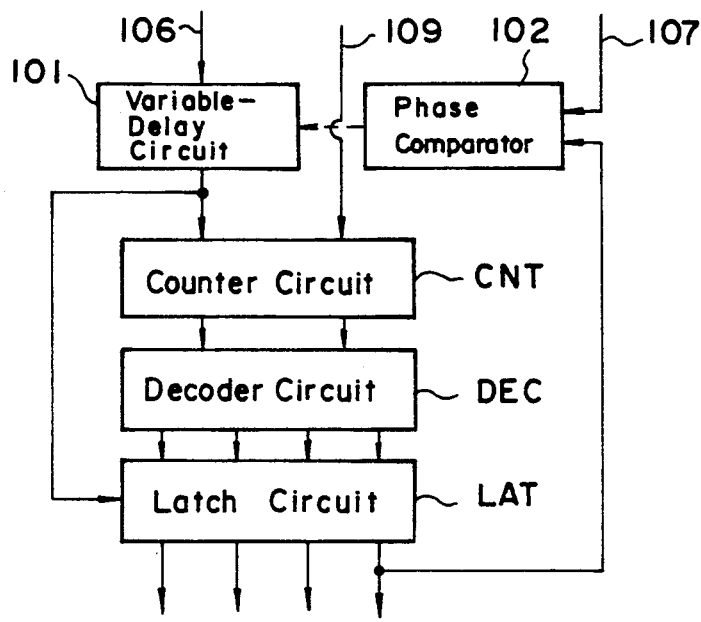
Figure 12:
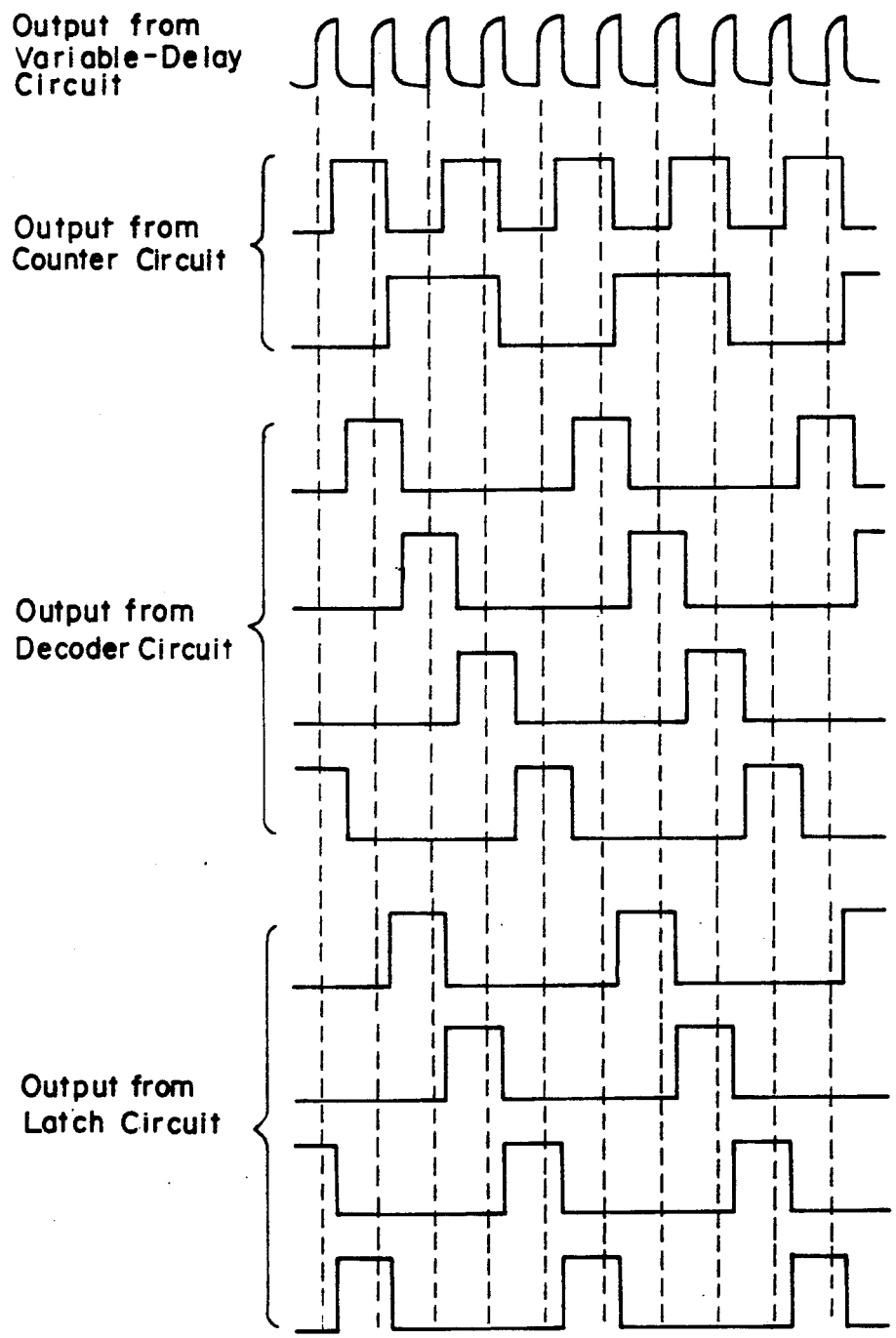
FIG. 12 is a waveform chart to explain the operation of the circuit shown in FIG. 10.

Further, if multi-phase clock signals are to be transmitted, or when clock signals of the duty cycle other than 50% should be obtained, a counter CNT or the like may be employed as shown in FIG. 10. FIG. 10 shows an example where clock signals of four phase and duty cycle of 25% are transmitted. FIG. 12 shows an example of output waveform from the variable-delay circuit 101, the counter CNT, the decoder DEC, and the latch circuit LAT. There are a number of gate stages between the output of the variable-delay circuit 101 and the output of the decoder DEC, and the number of gate stages may differ depending on the passage the signal passes. Therefore, the phase difference in output signals of the decoder DEC is not necessarily constant. By providing a latch circuit LAT, the phase difference and the pulse widths can be aligned with the period of the output signal of the variable delay circuit 101 or integral multiples. As shown in FIG. 10, if one of the phases is adjusted, other phase are automatically adjusted.

Figure 11:
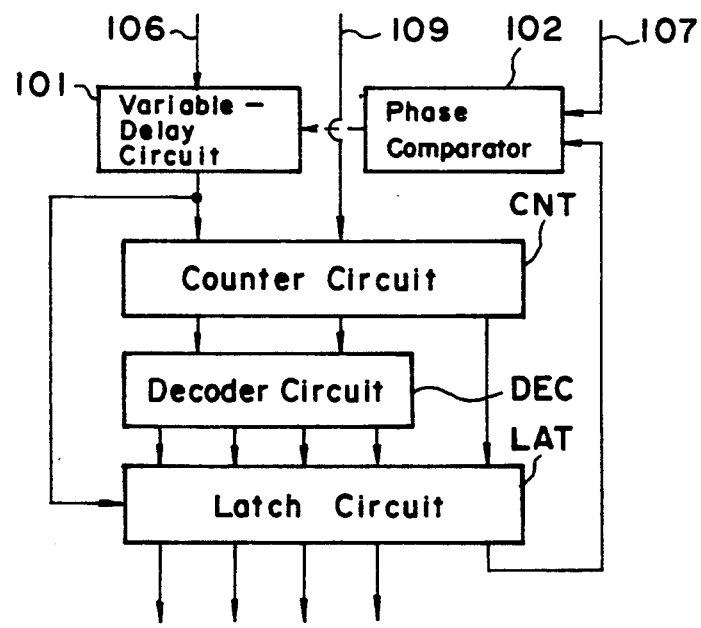

If the period of the reference signals should be made longer than that of the clock signals, the signals for comparison should be separated from the clock signals as illustrated in FIG. 1. As the exterior of an integrated circuit has a longer signal wiring than the interior generally and therefore it is difficult to transmit pulses of high speed, reference signals of a short period may possibly not be transmitted at a high speed even if clock signals of the same short period can be used inside the circuit. In such a case, structure shown in FIG. 11 is effective.

Figure 13:
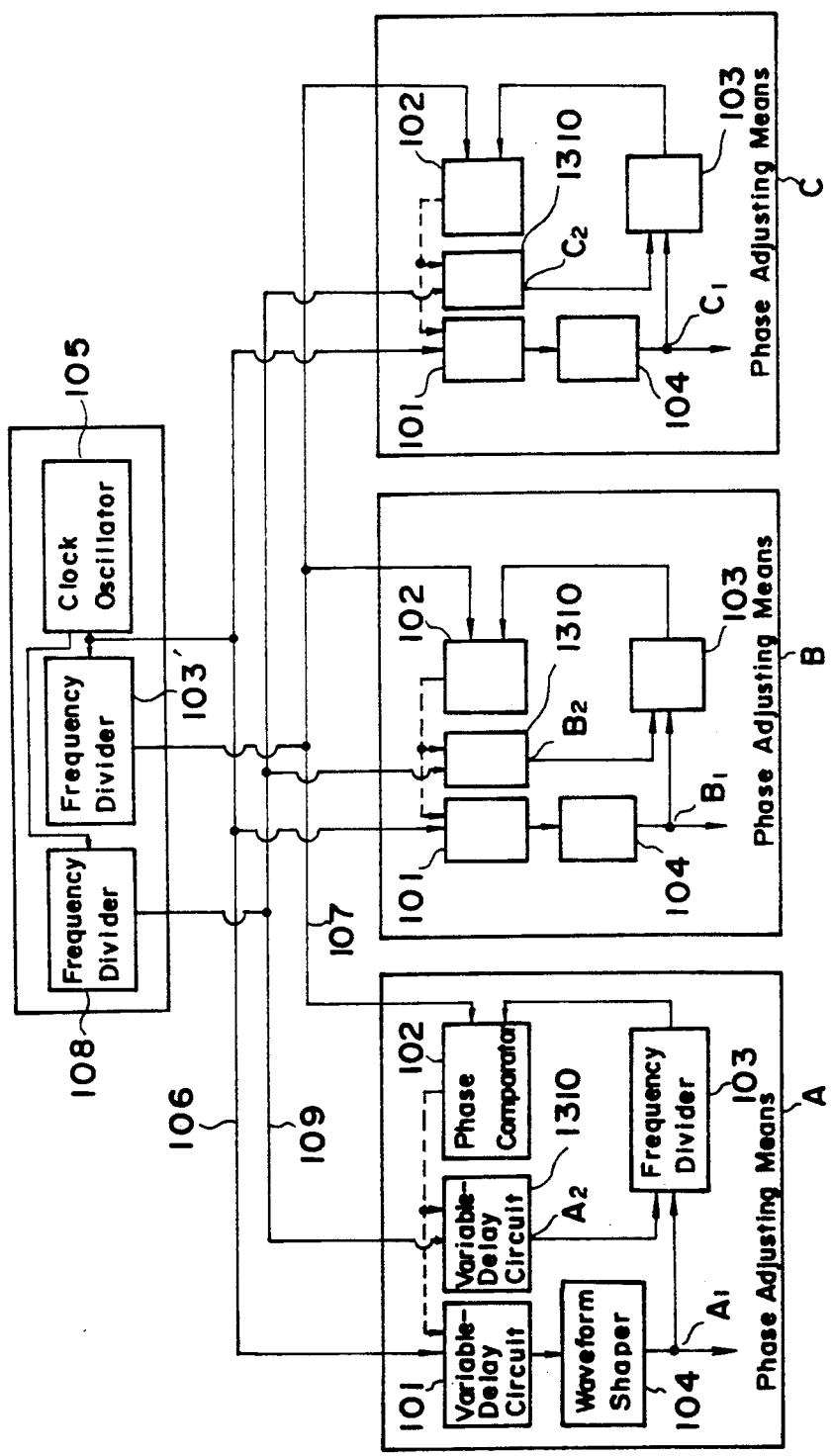
FIG. 13 is a block diagram showing a second embodiment of this invention.

FIG. 13 shows a configuration of a second embodiment of the present invention.

The construction of this embodiment is similar to the one shown in FIG. 1 except for variable-delay circuits 1310 additionally provided in the phase adjusting means A, B and C for controlling synchronizing signals on the third signal line 109. The variable-delay circuits 101 and 1310 are concurrently controlled with the output from the phase comparator circuit 102.

More particularly, the transmission delay time of variable-delay circuits 101 and 1310 are controlled in a manner that the phase of the output signal from the frequency divider 103 and of the reference signal transmitted through the second signal line 107 are agreed while stably maintaining the synchronization at the frequency divider 103 by feeding back the result of comparison by the phase comparator circuit 102 to the circuits 101 and 1310. Similarly to the embodiment shown in FIG. 1, the times required to transmit signals through the second signal line 107 to all the destinations are adjusted to be equal to each other, and by coinciding the phase of the clock signals distributed to each destination with the phase of the reference signal, the phase of clock signals at all the destinations are agreed.

The time required to transmit a clock signal from the clock signal source 105 to the frequency divider 103 via the variable-delay circuit 101 and the node point A1 in the means A, Ta1 is controlled constantly to be substantially the same as the time required to transmit a signal from the source 105 to the frequency divider 103 via the variable delay circuit 1310 and the node A2, in the means A or Ta2. Similarly, the time required to transmit a signal from the source to the frequency divider 103 via the variable delay circuit 101 and the point B1 in the means B, Tb1 and the time required to transmit a signal to the frequency divider 103 via the frequency divider 108, the variable delay circuit 1310 and the point B2 in the means B, Tb2 are controlled to become substantially the same. The time needed to transmit a signal to the frequency divider 103 via the variable-delay circuit 101 and the point C1 in the means C, Tc1 and that needed to transmit it to the frequency divider via the frequency divider 108, the variable delay circuit 1310, and the point C2, Tc2 are controlled to become substantially the same. It is not necessary, however, to control the chronological relationship between Ta1, Tb1 and Tc1 and that among Ta2, Tb2 and Tc2 to coincide with each other.

In the embodiment shown in FIG. 13, the clock signals generated by the clock oscillator 105 are supplied to the phase adjusting means A, B and C at destinations via the first signal line 106 and the phases of the clock signals are adjusted by varying the delay time of the variable delay circuits 101 therein. The variable-delay circuit 1310 works in such a manner that the phase of synchronizing signals received from the frequency divider 108 via the third signal line 109 are adjusted by controlling the delay time similarly to the control of the delay time at the circuit 101 to thereby perform a stable dividing operation of the frequency divider 103 irrespective of the variation of the delay time of the circuit 101.

This embodiment can effectively prevent such inconveniences as might be encountered in the first embodiment that the phase become coincident to each other by the making up difference equivalent to integral multiple of the period of clock signal in a steady state if there exists a difference larger than one half of the period of the clock signal between Ta, Tb and Tc in the initial state.

Figure 14:
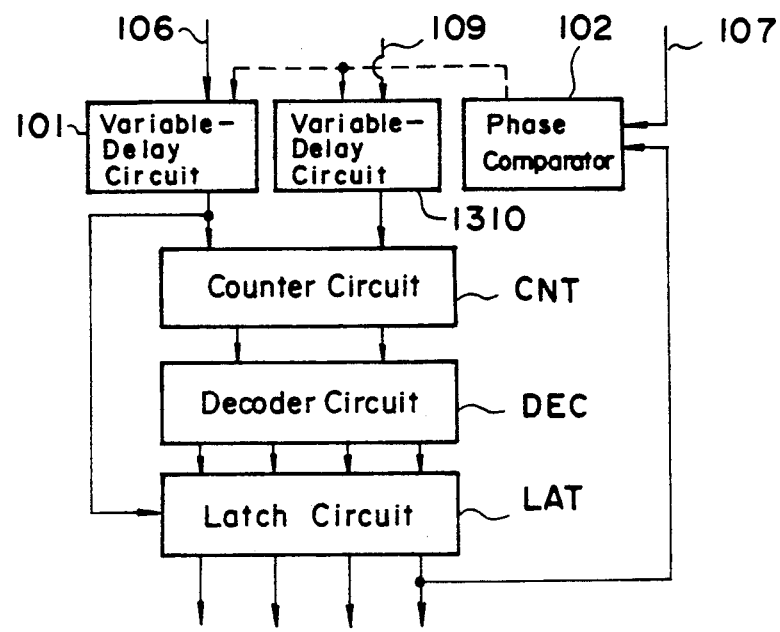
FIGS. 14 and 15 are block diagrams showing component elements of the second embodiment.
Figure 15:
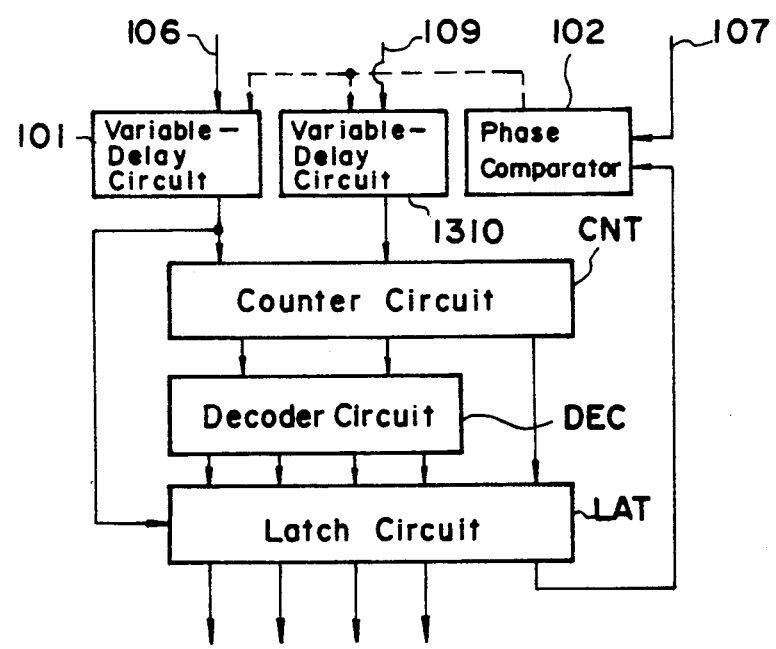

FIGS. 14 and 15 show further forms of the phase adjusting means in the second embodiment. This invention can be realized if the phase adjusting means provided at destinations shown in FIG. 13 are replaced by either one of the means shown in FIG. 14 and FIG. 15.

Description of the operation of the circuits shown in FIGS. 14 and 15 is omitted herein as it is identical to that described in relation to the first embodiment in FIGS. 10 and 11 except that a variable-delay circuit is added to the signal line which supplies synchronizing signals to the counter. It is obvious that this invention can be realized even if a variable-delay circuit is inserted in the line for supplying synchronizing signals in FIGS. 8 and 9 and the delay time is controlled with the output from the phase comparator circuit.

Description for specific formation of the component circuit is omitted herein as they may be formed substantially the same as those of the first embodiment as illustrated in FIGS. 2 through 6.

Figure 16:
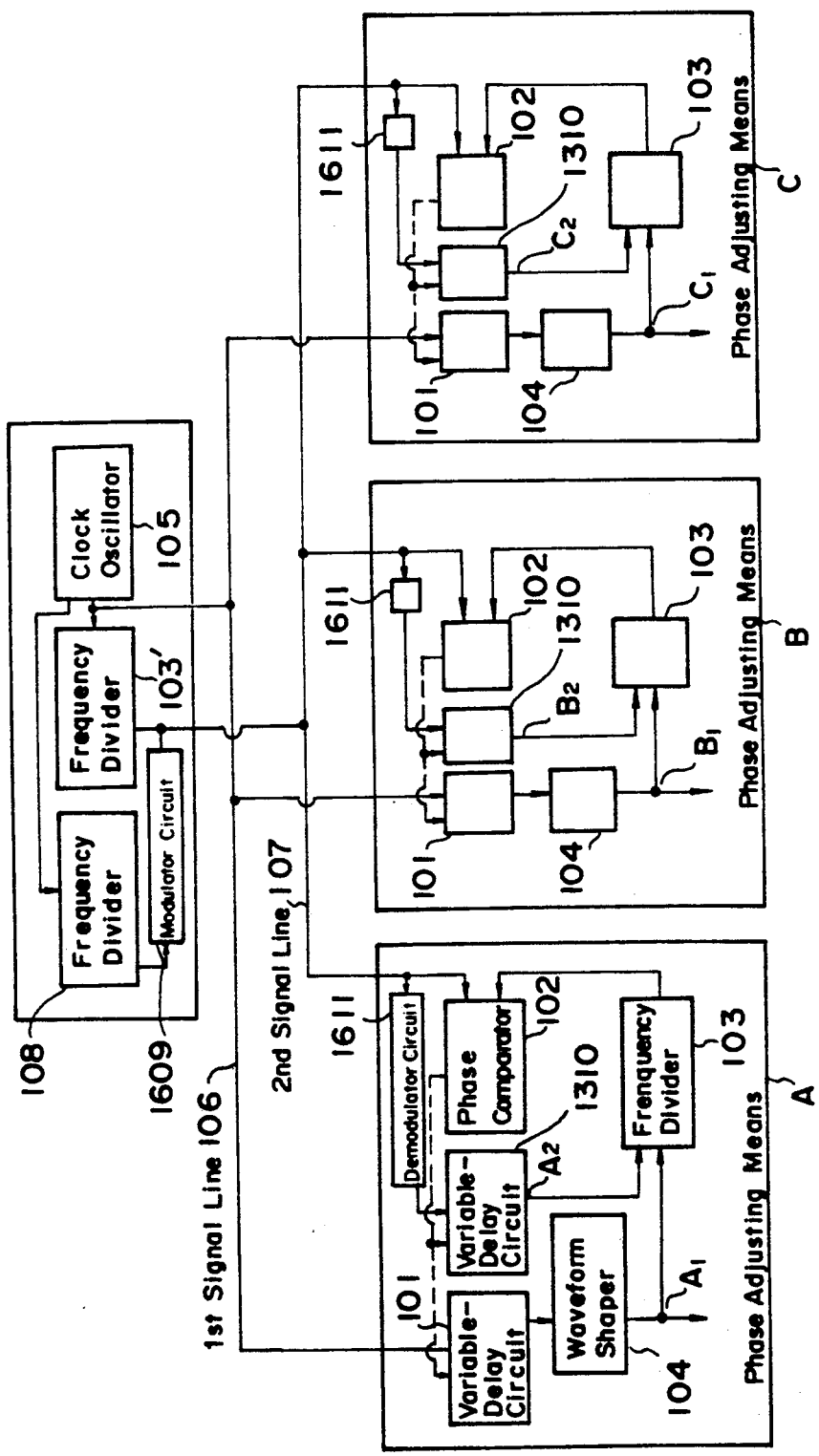
FIG. 16 is a block diagram showing a third embodiment of this invention.

FIG. 16 shows a third embodiment of the present invention.

The configuration of this embodiment is substantially the same as that of the second embodiment shown in FIG. 13 but the third signal line used in the second embodiment is omitted and there are provided instead a signal modulator 1609 which modulates the output from the frequency divider 108 and signal demodulators 1611 in the means A, B and C which demodulate the modulated signals. The second signal line 107 is also used as the third signal line. The signal modulator 1609 modulates synchronizing signals generated by the synchronizing signal forming means 108.

As the operation of the embodiment shown in FIG. 16 is similar to that described in relation with FIG. 13 except that the second signal line 107 is used also as the third signal line which is provided separately in the second embodiment as denoted by 109 in FIG. 13, description is limited here only to the operations by the modulator 1609, the demodulator 1611 and the phase comparator circuit 102 of FIG. 16.

Explanation will now be given to the specific example where the modulator 1609 and the demodulator 1611 comprise inverter circuits for inverting signal polarities.

When the phase comparator circuit 102 is so formed that the phase of a reference signal supplied to the phase adjusting means A, B and C via the second signal line 107 is determined at the trailing edge of the signal, the leading edge of the reference signal is not used as information transmission means. Therefore, the leading edge of a synchronizing signal can be used as the phase for synchronization if the synchronizing signal is inverted in polarity when the synchronizing signals are supplied to the means A, B and C via the second line 107. An inverter is used for the modulator 1609 to invert the output signal from the frequency divider 108 which acts as a synchronizing signal generating means. The inverted signal is connected to the output of the frequency divider 103' which acts as a reference signal generating means to thereby supply a mixture of the reference signal and the synchronizing signal to the second signal line 107. Alternatively, an OR circuit may be used if direct connection of the reference signal with the synchronizing signal is not desirable. In the case where the leading edge (high-level period) of the reference signal is not agreed timewise with the trailing edge (low-level period) of the synchronizing signal, unnecessary information would possibly be supplied through the line 107. However, this inconvenience could easily be prevented by shifting either one or both of the phases at the trailing edge of the synchronizing signal and the leading edge of the reference signal.

The demodulator 1611 provided in each of the means A, B and C acts to invert the reference and synchronizing signals supplied in mixture via the second signal line 107 by the inverter circuit and to generate an output signal indicative of the synchronizing signal in the form of the phase at the leading edge to the frequency divider 103. synchronizing signal to generate In a modification of the embodiment shown in FIG. 16, the modulator 1609 and the demodulator 1611 may be arranged respectively at an output side of the frequency divider 103' forming the reference signal and at an input side of the phase comparator circuit 102, but not arranged on the signal line for transmitting the synchronizing signals therethrough. In this case, however, the signal line which transmits the reference signals therethrough includes the modulator 1609 and the demodulator 1611, and the fluctuation in delay time thereof will inevitably increase. This will make it more difficult to coincide all the signal transmitting times over the signal line. In this context, the configuration shown in FIG. 16 is preferable.

The phase comparator circuit 102 employable in this embodiment may be the one described in relation to the first embodiment shown in FIG. 6, but the sensitivity in comparison would be deteriorated if there is a large difference in the duty cycles between the reference signal and the signals obtained by dividing the frequency of the clock. A comparator circuit improved in this respect will be described referring to FIG. 17.

Figure 17:
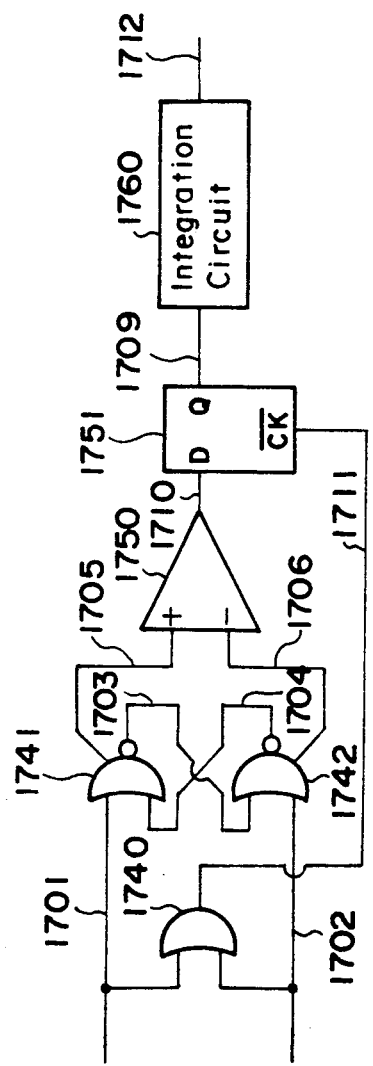
FIGS. 17, 19 and 20 are block diagrams to show component elements of the third embodiment.

FIG. 17 shows another form of the phase comparator circuit 102. The circuit is configured symmetrical for the two input signals to be compared in phases, so that it can increase the sensitivity as well as can work for two input signals with different duty cycles. The phase comparator circuit comprises an OR gate 1740, NOR gates 1741, 1742, a differential amplifier 1750, a latch circuit 1751 and an integration circuit 1760.

The operation of the circuit shown in FIG. 17 will now be described referring to FIGS. 18A and 18B.

Figure 18A:
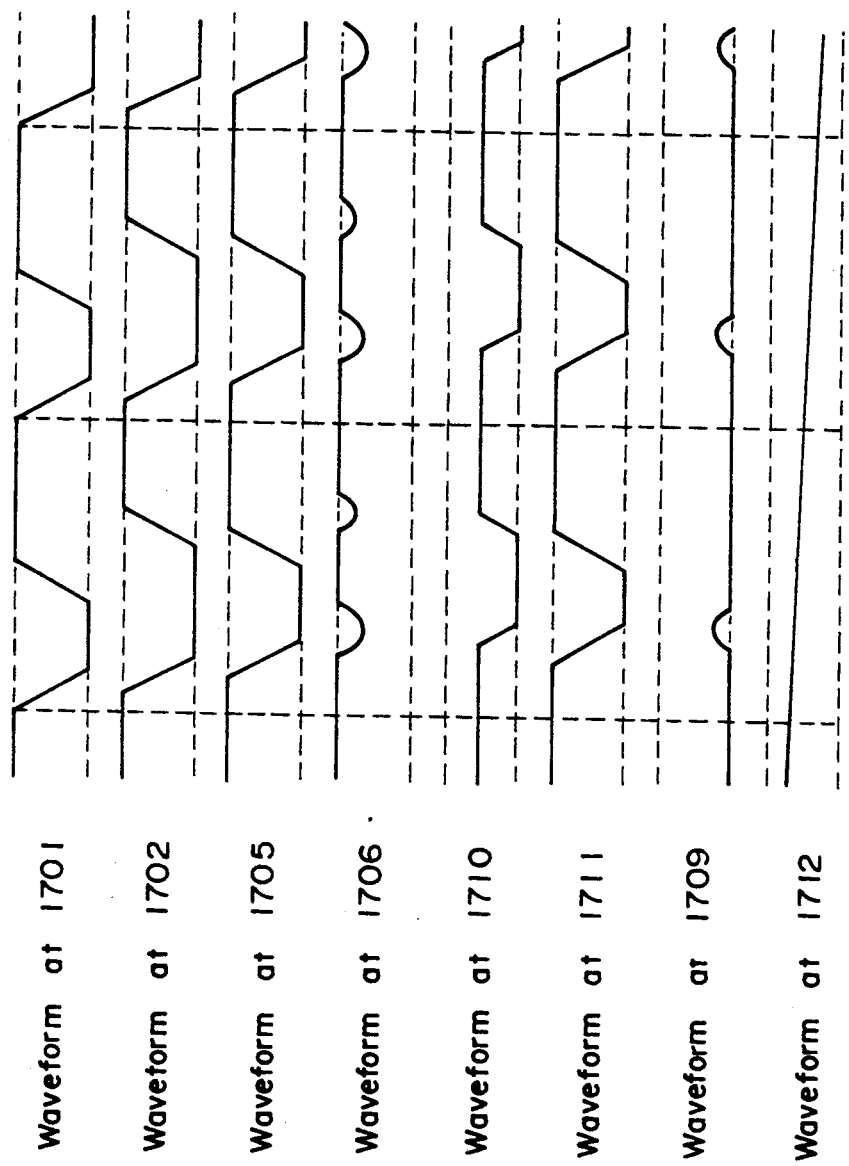

It is now assumed that the signals inputted to input terminals 1701, 1702 have such a relationship that the trailing edge of the signal inputted to the terminal 1701 is slightly advanced in phase compared to the trailing edge of the signal inputted to the terminal 1702 as shown in FIG. 18A. The signal inputted to the terminal 1701 appears at a terminal 1705 with time delay equivalent to one gate stage while the voltage at a terminal 1706 is kept almost constantly at high level. When the signals are passed through the differential amplifier 1750, the voltage appearing at the terminal 1710 becomes low level during the period when the input 1701 stays at low level (more specifically, shifted by the delay time for one gate stage and one stage of the differential amplifier) while it becomes the intermediate level otherwise. The latch circuit 1751 takes in the level of the voltage from the terminal 1710 only during the time when the signals applied to the input terminals 1701, 1702 stay at the low level. Therefore, almost all the voltages appearing at the terminal 1709 are at low level. This lowers the voltage at the terminal 1712 gradually. Conversely, when the trailing edge of the signal inputted at the terminal 1701 is delayed in phase from the trailing edge of the signal inputted at the terminal 1702, the voltage appearing at the terminal 1709 becomes almost constantly high level as shown in FIG. 18B to thereby gradually increase the voltage at the terminal 1712.

The circuit of FIG. 17 needs more component elements than the one shown in FIG. 6, but as the output waveform thereof is hardly influenced by the phase of the leading edge of the input signal, it is preferable for use for comparison of phases of signals with different duty cycles. As the result of one comparison is retained for one period, the output of the integration circuit 1760 responds with a higher sensitivity.

Figure 19:
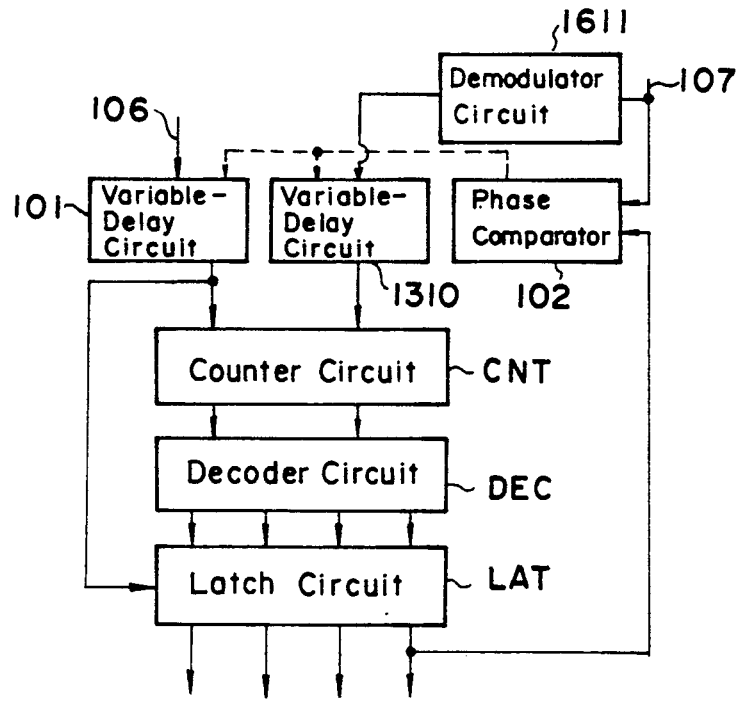
Figure 20:
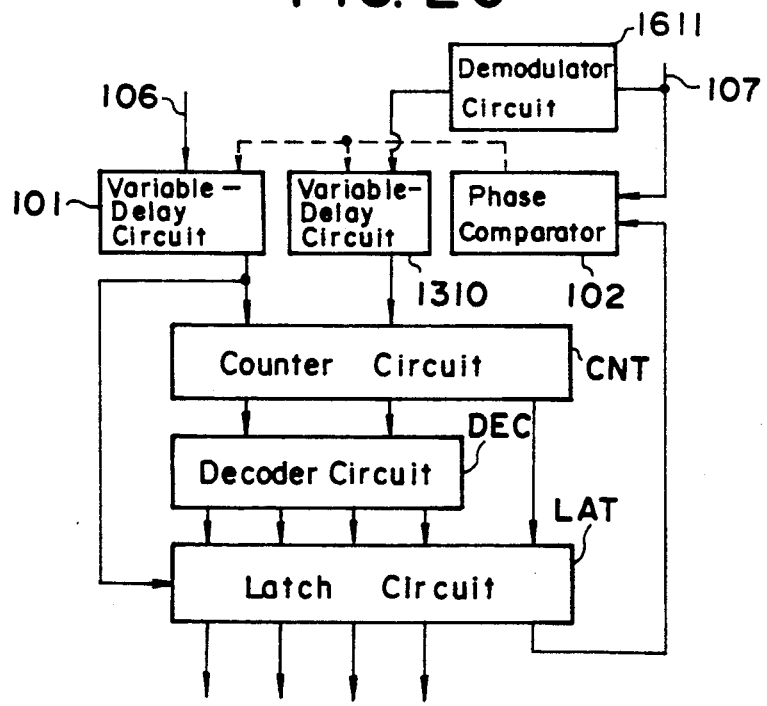

FIGS. 19 and 20 show further forms of the phase adjusting means employable for the third embodiment. The phase adjusting means provided at destinations in the embodiment shown in FIG. 16 may be replaced with either one of those shown in FIGS. 19 and 20.

Detailed description for the operations of the circuits of FIGS. 19 and 20 is omitted here as they are substantially the same as those of the second embodiment shown in FIGS. 14 and 15 except for a demodulator 1611 for separating the synchronizing signal out of the mixture of the reference and synchronizing signals.

Figure 8:
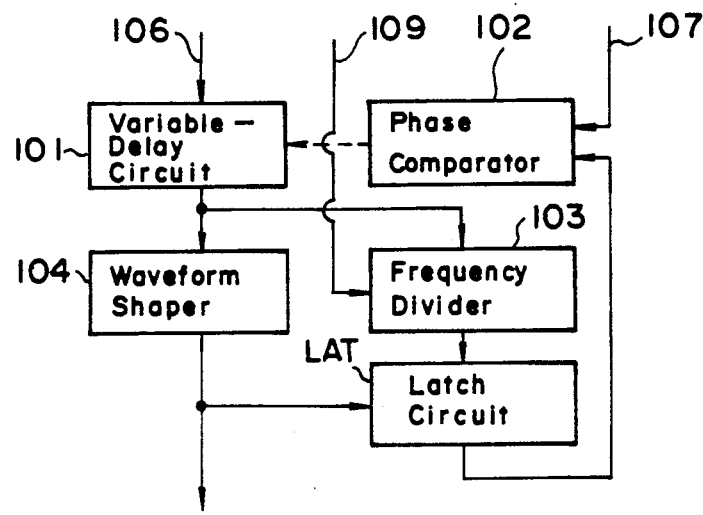
Figure 9:
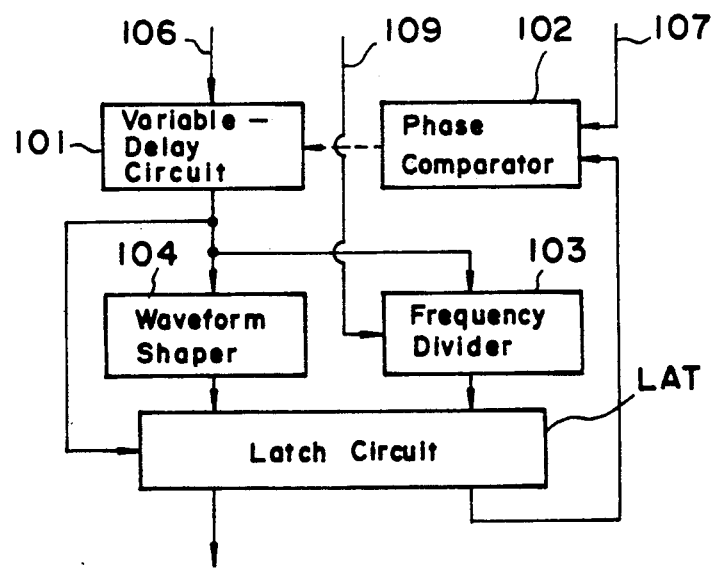

This invention may also be realized by providing, as a further alternative form of the phase adjusting means, a variable-delay circuit and a signal decoder circuit for the line for supplying the synchronizing signals described in relation with the first embodiment shown in FIGS. 8 or 9 with the input of the demodulator connected to the input for the reference signal.

When pulse signals are passed through signal lines, the voltage does not change instantly from the low level to the high level (or vice versa), but would gradually rise/fall within a certain rising (or falling) time. This causes no problems if the rising or falling time is shorter than the pulse width of clock signals, but when the pulse width is narrowed to increase the speed of clock signals, the fall of the signals starts even before the voltage rises sufficiently, and narrows the signal amplitude. This results in reduction in noise margin, and sometimes in variation of pulse widths or even extinction of pulse per se. Especially when the signal line is long, increase in load or skin effect becomes conspicuous to induce above mentioned phenomena. Such phenomena can be prevented by increasing the number of stages of buffers provided midway on the signal line to frequently shape pulses and preventing the rising or falling time from increasing. But this tends to accumulate fluctuations in signal delay time in the buffers to thereby further increase variation of pulse width or drifts of phase.

According to the preferred embodiments described above, if there is no need to consider variation of phases on the signal line, a buffer may be added at a desired location to shape pulses. If sinusoidal wave is formed midway of the signal line, an analogue type amplifier may be used to prevent attenuation of the signal. Accordingly, if the period of clock signal alone is to be transmitted, a signal with a much shorter period can be transmitted as compared with the case where the phase and/or pulse width are transmitted concurrently. The signal line where signals with a shorter pulse width cannot be transmitted due to attenuation would transmit signals of a larger pulse width with a relatively stable phase.

If the signal transmission time of the first signal line is adjusted so that the signal transmitted via the first signal line may be shaped for use as a clock signal and the phase of the reference signal transmitted via the second signal line and that of the signals obtained by dividing the frequency of the clock signal become coincidental to each other, clock signals can be supplied at a high speed in precise phase.

Although the preferred embodiments of the present invention have been described above, the present invention can also be realized by employing the following circuits in plural stages.

Figure 21:
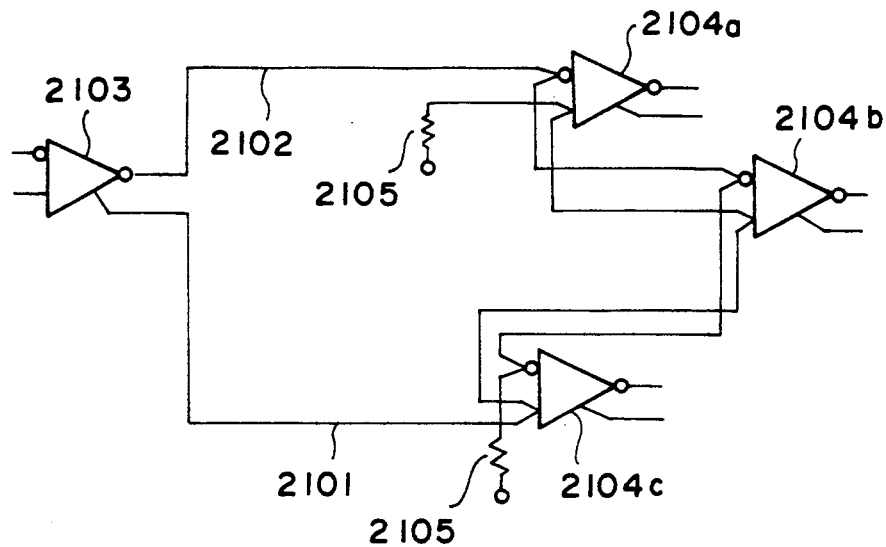
FIGS. 21 through 26 are explanatory views to illustrate circuits which may be used in combination with this invention.

FIG. 21 shows a configuration of the circuit wherein the reference numeral 2103 denotes a source circuit on the transmission end of clock signals. The clock signals are supplied through the signal line 2101 to sink circuits 2104a, 2104b, and 2014a in this order. Signals complementary with the clock signals are also supplied to the sink circuits 2104a, 2104b, 2104c in this order via the signal line 2102. The lengths of the signal lines 2101 and 2102 are substantially the same between the sink circuit 2104a and the sink circuit 2104b and between the circuits 2104b and 2104c. The signal lines 2101 and 2102 are connected to a terminal resistor 2105 after being connected to the last sink circuits respectively.

Figure 22:
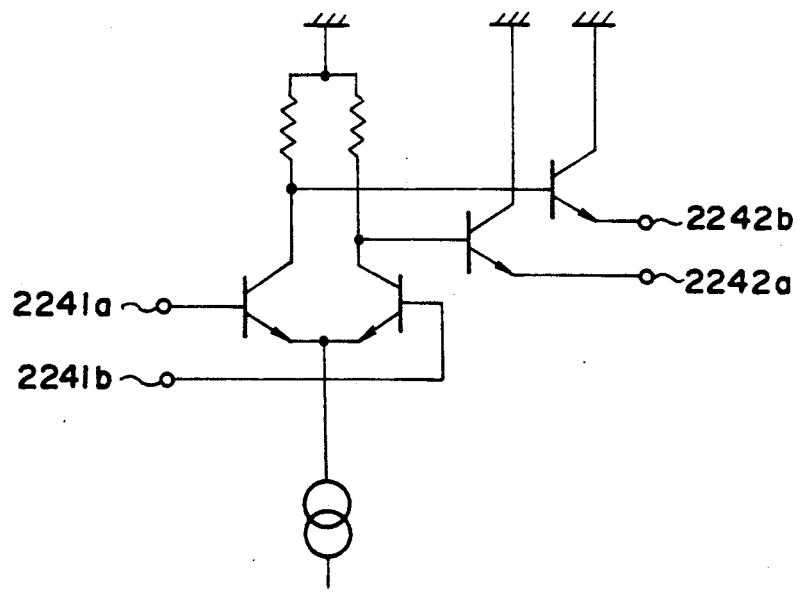

The sink circuits 2104a, 2104b and 2104c are differential circuits such as the one shown in FIG. 22. When the potential at 2241a is higher than an input 2241b, a high level output is obtained at an output 2242a and a low output at an output 2242b. When the potential of 2241a is lower than that at an input 2242a, a low level output is obtained at an output 2242a and a high level output at an output 2242b. In FIG. 21, the signal line 2101 is connected to the input 2241a of the differential circuit and the signal line 2102 is connected to the input 2241b thereof.

Figure 23A:
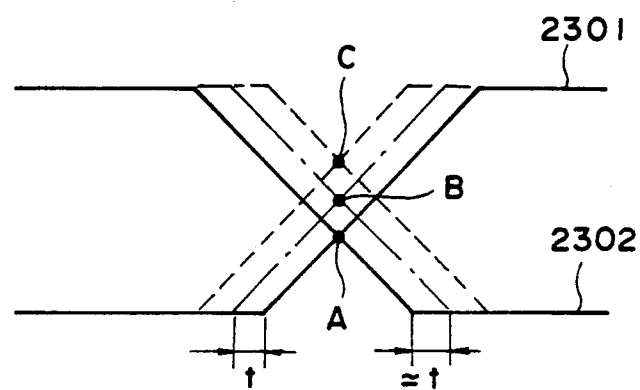
Figure 23B:
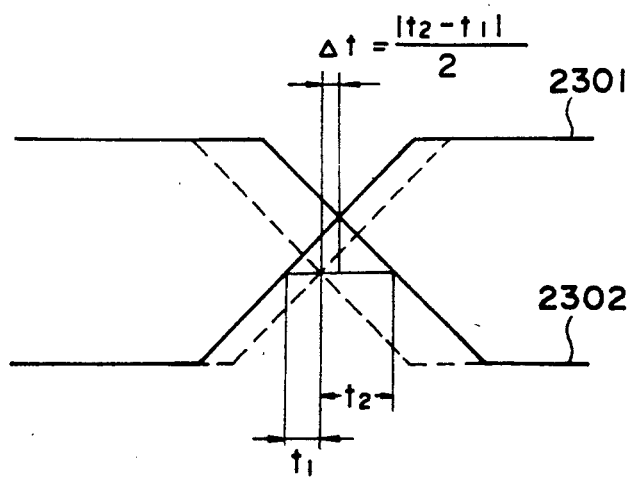
Figure 24:
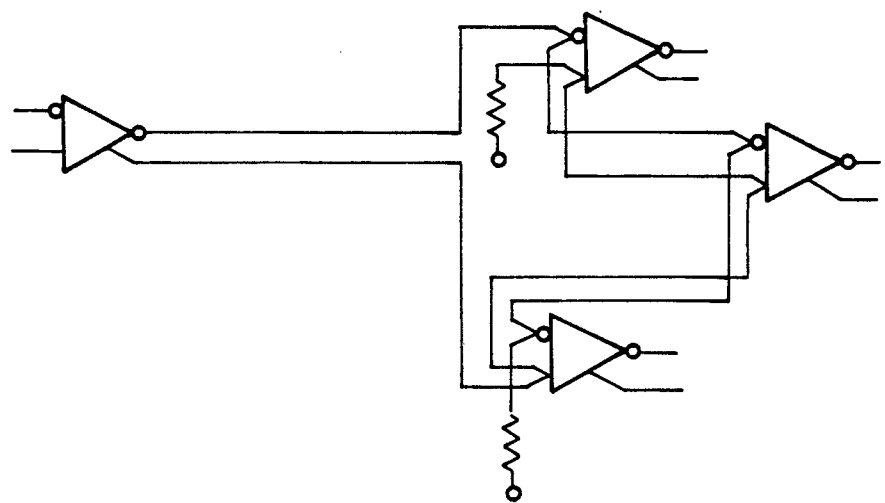

The operation of the circuit shown in FIG. 21 will now be described referring to FIGS. 23A and 23B. In FIG. 23A, the solid line denotes waveform generated by the sink circuit 2104a, the dot-and-chain line the waveform by the sink circuit 2104b, and the broken line the waveform by the sink circuit 2104c. If it is assumed that the time when the clock signal arrives at the sink circuit 2104a is delayed by t from the time it arrives at the sink circuit 2104b, as the wiring lengths between the sink circuits 2104a and 2104b are substantially identical as mentioned above, the time when the complementary signal arrives at the sink circuit 2104a is earlier by ca. t than the time it arrives at the sink circuit 2104b. If the rising time of the clock signals coincides with the falling time of the signals complementary to them, a point (point A in FIG. 23A) where the clock signal and the complementary signal become the same level is almost concurrent with a point (point B in FIG. 23B) where the clock signal and the complementary signal become substantially the same level at an input to the sink circuit 2104b. Similarly, a point (point C in FIG. 23A) where the clock signal and the complementary signal become the same level at an input point of the sink circuit 2104c is coincidental to the points A and B. Therefore, if the period in which clock signals are being transmitted over all the sink circuits and the period in which complementary signals are being transmitted are overlapped, then all the sink circuits are switched substantially concurrently. FIG. 23B shows the waveform at an input of one sink circuit by the solid line while the waveform at another input of another sink circuit by the broken line. The value tolerable as the difference between the delay time t1 of the clock signal and the delay time t2 of the complementary signal between the two inputs or $|t1-t2|$ is up to twofolds of the value tolerable as the time difference t in switching the two sink circuits. The difference of wiring length between the clock signal and the complementary signal in the sink circuits should be within the range as specified above. It is obvious from the aforementioned fact that switching time of each sink circuit may be coincided to each other by simply arranging the order of clock signal supply in the sequence of the sink circuits 2104a, 2104b and 2104c and that of the complementary signal supply in the sequence of 2104c, 2104b and 2104a, without the necessity of providing a plurality of source circuits nor providing wirings of the same length separately from the source circuit to the sink circuits respectively. It is not absolutely necessary to make the length of wiring for the clock signals from the source circuit 2103 to the sink circuit 2104c and that for the complementary signals from the source circuit 2103 to the sink circuit 2104a identical. This circuit can, therefore, reduce the space required for the system due to the reduction of the number of source circuits, power consumption, packaging area due to the reduction of wirings, and crosstalk noises. Thus, the number of the wirings for which the delay times should be equal to each other may be reduced and the length thereof may be shorter than that of the prior art. Therefore, even if some fluctuation occurs in the wiring delay per unit length, fluctuation at the switching time on the sink circuit may be made smaller and layout designing may be made easier.

Even if noises are induced in clock signals from outside, its effect can be reduced by partially arranging the clock signals and signals complementary to them in proximity to each other because noises of substantially the same waveform are induced in the complementary signals.

Figure 25:
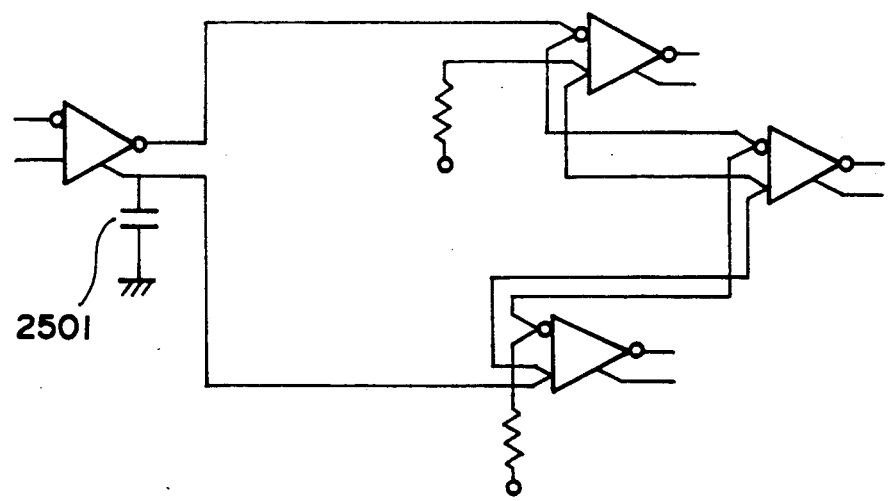

When the rising time of the clock signals is different from the falling time of the signal complementary thereto, for example, when the rising time of clock signals is shorter than the falling time of the complementary signals, as shown in FIG. 25, the rising may be dulled by adding a capacitance 2501 to the clock signals. This sometimes impairs concurrence in switching of the sink circuits 2104a, 2104b and 2104c in opposite polarities, or more particularly from high level to low level of clock signals or from low level to high level of complementary signals, but there will be no significant problems as clock signal is required to have the same switching time at either the leading or the trailing edge of pulses.

Figure 26:
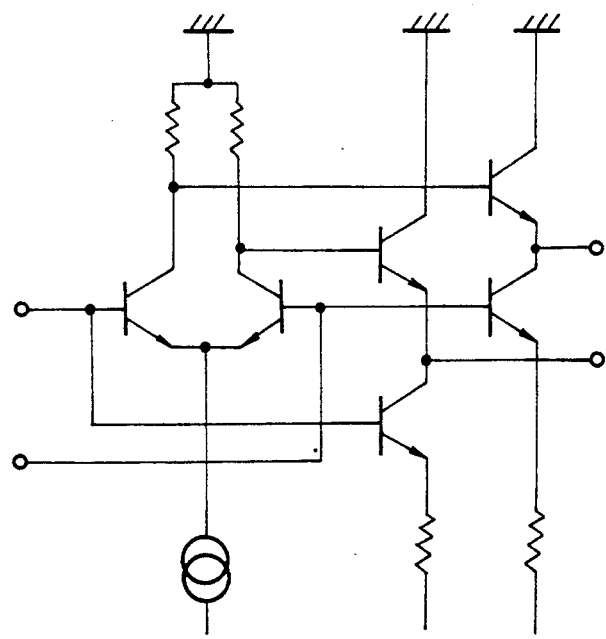
Figure 27A:
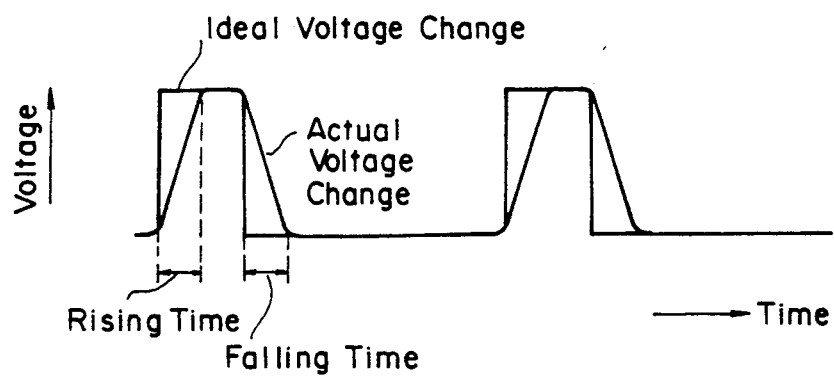
FIGS. 27A and 27B are explanatory views to describe a secondary effect of the first embodiment.
Figure 27B:
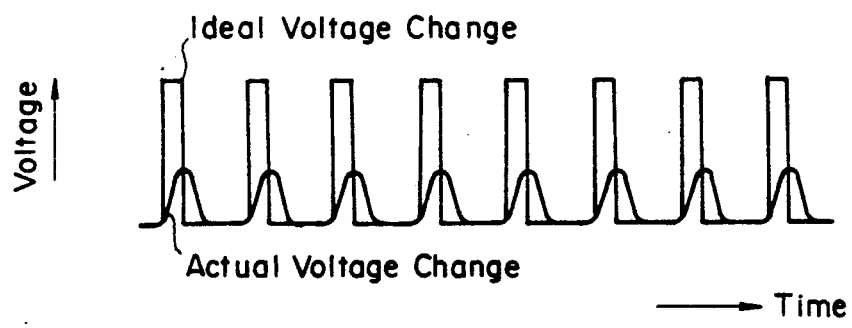

The rising time and the falling time may be made identical to each other by using a push-pull circuit shown in FIG. 26 as the source circuit.

If the above mentioned circuits are combined in plural stages with this invention system, it can achieve a clock signal supply system which needs less wirings and space but can supply clock signals precisely. The circuit may be used at any desired place in a clock signal distributing system. For example, it may be used when clock signals are distributed from a clock oscillator to plural modules, when clock signals are distributed to IC chips on the modules or when clock signals are distributed to plural circuits formed on the IC chips.

Figure 28:
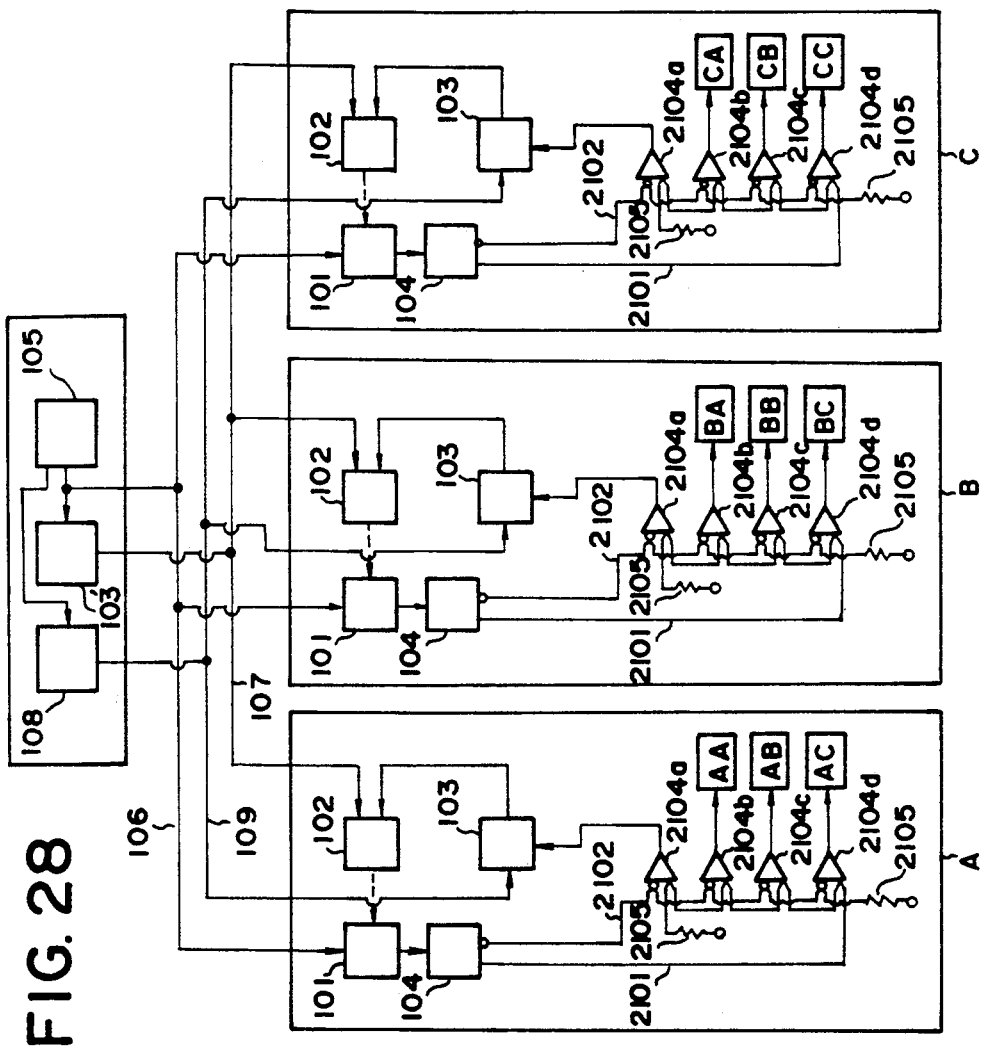
FIG. 28 is a block diagram to show still another embodiment of this invention.

FIG. 28 shows an example in which the first embodiment of this invention (the circuit shown in FIG. 1) is combined with the aforementioned circuits in two stages. Clock signals are distributed to the destinations A, B and C by the circuit shown in FIG. 1 and the clock signals are further distributed to plural destinations AA, AB, AC provided further ahead in each of the destinations by said circuit. If such a construction as shown in FIG. 28 is used, clock signals may be distributed to a large number of destinations with a relatively small number of wirings.

We claim:

1. A clock signal supply method, said method comprising the steps of:
   generating a clock signal at a clock signal generating source end;
   generating a reference signal and a synchronizing signal, both said reference signal and said synchronizing signal based on said clock signal at said clock signal generating source end, both said reference signal and said synchronizing signal having a period longer than that of said clock signal;
   delivering said clock signal, said reference signal and said synchronizing signal to each of a plurality of clock signal destination ends;
   delaying said clock signal delivered to said clock signal destination ends;
   frequency-dividing said delayed clock signal in synchronism with said synchronizing signal at each one of said clock destination ends;
   comparing in phase a resultant frequency-divided signal with said reference signal at each one of said clock destination ends; and
   controlling said delay of said clock signal at each one of said clock destination ends in accordance with a result of said comparing step such that said resultant frequency-divided signal and said reference signal coincide in phase with each other.

2. A clock signal supply system, comprising:
   a clock oscillator for generating a clock signal;
   reference signal generating means for generating a reference signal having a period longer than that of said clock signal;
   synchronizing signal generating means for generating a synchronizing signal having a period longer than that of said clock signal;
   a plurality of phase adjusting means, each for receiving said clock signal, said reference signal and said synchronizing signal, adjusting a phase of said clock signal to produce a phase-adjusted output based on a control signal such that said phase-adjusted output is frequency-divided in synchronism with said synchronizing signal and comparing a phase of a resultant frequency-divided clock signal with a phase of said reference signal to provide a result of said comparison as said control signal;
   a first signal line for supplying said clock signal from said oscillator to each one of said phase adjusting means;
   a second signal line for supplying a reference signal from said reference signal generating means to each one of said phase adjusting means; and
   a third signal line for supplying said synchronizing signal from said synchronizing signal generating means to each one of said phase adjusting means.

3. A clock signal supplying system as claimed in claim 2, wherein said second signal line has substantially same propagation times for said reference signal to said respective phase adjusting means.

4. A clock signal supplying system as claimed in claim 2, wherein a propagation time of said synchronizing signal from said synchronizing signal generating means is set for each one of said phase adjusting means so that said resultant frequency-divided clock signal in a given phase adjusting means has a phase close to that of said respective reference signal supplied from said reference signal generating means to said given phase adjusting means.

5. A clock signal supplying system as claimed in claim 2, wherein periods of said reference signal and of said synchronizing signal are two multiple or larger integral multiple of said period of said clock signal.

6. A clock signal supply system as claimed in claim 2, wherein each phase adjusting means comprises:
   a variable-delay circuit which variably delays said clock signal;
   a frequency dividing circuit for dividing an output from said variable-delay circuit and a phase comparator circuit which compares in phase said output from said frequency dividing circuit with said reference signal and controls each one of said variable-delay circuits according to said result of said comparison by said phase comparator circuit.

7. A clock signal supplying system as claimed in claim 6, wherein each one of said phase adjusting means further comprises:
   a waveform shaper which shapes said output from said variable-delay circuit to input a shaped signal to said frequency dividing circuit.

8. A clock signal supplying system as claimed in claim 6, wherein each one of said phase adjusting means further comprises another variable-delay circuit for variably delaying said synchronizing signal, the delay of said another variable delay circuit being controlled according to said result of said comparison by said phase comparator circuit.

9. A clock signal supplying system as claimed in claim 2, wherein said second signal line for said reference signal and said third signal line for said synchronizing signal are provided in a form of a single signal line, and said synchronizing signal from said synchronizing signal generating means is supplied to each one of said phase adjusting means by sharing a common signal line with said reference signal from said reference signal generation means.

10. A clock signal supplying system as claimed in claim 9, further comprising a modulator which modulates said synchronizing signal from said synchronizing signal generating means to supply said synchronizing signal through said second signal line and demodulators each of which demodulates said synchronizing signal fed to each of said phase adjusting means through said second line to provide an output form said demodulator as said synchronizing signal for said phase adjusting means.

11. A clock signal supplying system as claimed in claim 6, wherein each of said phase adjusting means further comprises a latch circuit which latches said output from said frequency dividing circuit according to said output from said variable-delay circuit so that said output from said latch circuit may be supplied to said phase comparator circuit.

12. A clock signal supplying system as claimed in claim 2, wherein each of said phase adjusting means comprises: a variable-delay circuit which variably delays said clock signal, a counter which counts said output from said variable-delay circuit in synchronism with said synchronizing signal, a decoder which decodes said output from said counter, and a latch circuit which latches said output from said decoder according to said output from said variable-delay circuit, thereby to supply one output from said latch circuit to said phase comparator circuit.

13. A clock signal supplying system as claimed in claim 2, wherein said phase-adjusted outputs from said plurality of phase adjusting means are further supplied to a plurality of terminal destinations, each one of said terminal destinations including a differential circuit, said phase-adjusted outputs being used as complementary signals and are supplied through said differential circuits in opposite orders.

14. A clock signal supply system comprising:
a clock oscillator for generating a clock signal;
a plurality of phase adjusting means each of which receives said clock signal supplied thereto to adjust a phase of said clock signal between the plural means and produces a phase-adjusted output, said phase adjusting means adjusts said phase of said clock signal by comparing said phase-adjusted output from said phase adjusting means with a given signal to be used as a reference;
a first frequency dividing means for frequency-dividing said clock signal generated by said clock oscillator to produce a first frequency-divided signal to supply as said reference in said comparison;
a second frequency dividing means for frequency-dividing said phase-adjusting output from said phase adjusting means to produce a second frequency-divided signal to be compared with said reference in said comparison; and
a third frequency dividing means for frequency-dividing said clock signal generated by said clock oscillator to produce a third frequency-divided signal for use as a synchronizing signal for synchronizing the frequency-division by said second frequency dividing means.

15. A clock signal supply system as claimed in claim 14, wherein each of said phase adjusting means comprises said second frequency dividing means, means for comparing said second frequency-divided signal with said reference and means for controlling a delay of said clock signal supplied to said phase adjusting means.

* * * * *